(12) United States Patent
Li et al.

(10) Patent No.: US 12,282,219 B2
(45) Date of Patent: Apr. 22, 2025

(54) LIQUID CRYSTAL DISPLAY PANEL AND METHOD OF MANUFACTURING THE SAME, AND DISPLAY APPARATUS

(71) Applicants: BEIJING BOE DISPLAY TECHNOLOGY CO., LTD., Beijing (CN); BOE TECHNOLOGY GROUP CO., LTD., Beijing (CN)

(72) Inventors: Bowen Li, Beijing (CN); Feifei Wang, Beijing (CN); Lintao Ji, Beijing (CN); Hongming Zhan, Beijing (CN); Kaixuan Wang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/802,568

(22) PCT Filed: Sep. 15, 2021

(86) PCT No.: PCT/CN2021/118594
§ 371 (c)(1),
(2) Date: Aug. 26, 2022

(87) PCT Pub. No.: WO2023/039764
PCT Pub. Date: Mar. 23, 2023

(65) Prior Publication Data
US 2024/0192543 A1    Jun. 13, 2024

(51) Int. Cl.
*G02F 1/1335* (2006.01)
*G02F 1/1333* (2006.01)
(Continued)

(52) U.S. Cl.
CPC .. *G02F 1/133516* (2013.01); *G02F 1/133357* (2021.01); *G02F 1/133519* (2021.01);
(Continued)

(58) Field of Classification Search
CPC ......... G02F 1/133723; G02F 1/133519; G02F 1/13363
See application file for complete search history.

(56) References Cited

U.S. PATENT DOCUMENTS

2005/0225238 A1    10/2005  Yamazaki
2007/0200987 A1*   8/2007   Yoda ................... G02F 1/13363
                                                              349/119
(Continued)

FOREIGN PATENT DOCUMENTS

CN    1845648 A    10/2006
CN    1928669 A    3/2007
(Continued)

OTHER PUBLICATIONS

"Other functional polyimide", excerpted from the book "Handbook of Plastics Industry-Polyamide" (Chemical Industry Press, Nov. 2001, 1st edition, edited by Peng Zhihan et al., pp. 677-678).

*Primary Examiner* — Alexander P Gross
(74) *Attorney, Agent, or Firm* — XSENSUS LLP

(57) ABSTRACT

A liquid crystal display panel includes a first substrate, a second substrate and a liquid crystal layer. The first substrate and the second substrate are disposed opposite to each other, and the liquid crystal layer is located between the first substrate and the second substrate. The first substrate includes a first base, a color filter layer and a first planarization layer. The color filter layer is located on a side of the first base proximate to the liquid crystal layer, and the first planarization layer is located on a side of the color filter layer proximate to the liquid crystal layer and covers the (Continued)

color filter layer. A material of the first planarization layer includes a resin mixture containing polyimide.

12 Claims, 8 Drawing Sheets

(51) Int. Cl.
  *G02F 1/13363* (2006.01)
  *G02F 1/1337* (2006.01)
  *G03F 7/00* (2006.01)
(52) U.S. Cl.
  CPC .... *G02F 1/13363* (2013.01); *G02F 1/133634* (2013.01); *G02F 1/133723* (2013.01); *G03F 7/0007* (2013.01)

(56) References Cited

U.S. PATENT DOCUMENTS

2009/0190075 A1* 7/2009 Kim .................. G02F 1/133512
  349/187

| | | | |
|---|---|---|---|
| 2020/0111844 A1 | 4/2020 | Jing et al. | |
| 2020/0241363 A1 | 7/2020 | Ma et al. | |
| 2021/0382357 A1 | 12/2021 | Shao et al. | |

FOREIGN PATENT DOCUMENTS

| | | | | |
|---|---|---|---|---|
| CN | 102221759 A | 10/2011 | | |
| CN | 102629025 A | 8/2012 | | |
| CN | 104460142 A | 3/2015 | | |
| CN | 107482044 A | 12/2017 | | |
| CN | 107722268 A | 2/2018 | | |
| CN | 107887526 A | 4/2018 | | |
| CN | 108535911 A | 9/2018 | | |
| CN | 109300959 A | 2/2019 | | |
| CN | 109752877 A | 5/2019 | | |
| CN | 109799650 A | 5/2019 | | |
| CN | 111413827 A | 7/2020 | | |
| CN | 111999928 A | 11/2020 | | |
| CN | 112859418 A | 5/2021 | | |
| TW | 546523 B | 8/2003 | | |
| TW | 200742876 A | 11/2007 | | |
| WO | WO-2012018121 A1 | * 2/2012 | ......... | C08G 73/1053 |
| WO | WO-2013024849 A1 | * 2/2013 | ............ | C08G 73/10 |

* cited by examiner

LIQUID CRYSTAL DISPLAY PANEL AND METHOD OF MANUFACTURING THE SAME, AND DISPLAY APPARATUS

CROSS-REFERENCE TO RELATED APPLICATION

This application is a national phase entry under 35 USC 371 of International Patent Application No. PCT/CN2021/118594, filed on Sep. 15, 2021, which is incorporated herein by reference in its entirety.

TECHNICAL FIELD

The present disclosure relates to the field of display technologies, and in particular, to a liquid crystal display panel and a method of manufacturing the same, and a display device.

BACKGROUND

Liquid crystal displays (LCDs) have been widely used due to their advantages such as low power consumption, miniature size, lightness and thinness. For example, the liquid crystal displays have been applied to various fields such as mobile phones, flat panel displays, vehicles, televisions and public displays.

SUMMARY

In an aspect, a liquid crystal display panel is provided. The liquid crystal display panel includes a first substrate, a second substrate and a liquid crystal layer. The first substrate and the second substrate are disposed opposite to each other, and the liquid crystal layer is located between the first substrate and the second substrate. The first substrate includes a first base, a color filter layer and a first planarization layer. The color filter layer is located on a side of the first base proximate to the liquid crystal layer, and the first planarization layer is located on a side of the color filter layer proximate to the liquid crystal layer and covers the color filter layer. A material of the first planarization layer includes a resin mixture containing polyimide.

In some embodiments, the resin mixture further contains an acrylic resin.

In some embodiments, a transmittance of the first planarization layer for any light ray in a visible range is greater than or equal to 90%.

In some embodiments, a birefringence of the first planarization layer for any light ray in a visible range is less than or equal to 0.002.

In some embodiments, the first planarization layer also serves as a first alignment film.

In some embodiments, the liquid crystal display panel further includes a first alignment film. The first alignment film is located between the first planarization layer and the liquid crystal layer.

In some embodiments, the first substrate further includes a first optical compensation layer. The first optical compensation layer is located on a side of the first planarization layer proximate to the liquid crystal layer.

In some embodiments, the first optical compensation layer is a +A compensation film layer.

In some embodiments, the first substrate further includes a second planarization layer. The second planarization layer is located on a side of the first optical compensation layer proximate to the liquid crystal layer.

In some embodiments, a material of the second planarization layer is the same as the material of the first planarization layer.

In some embodiments, the second planarization layer also serves as a first alignment film.

In some embodiments, the second substrate includes a second base, a circuit structure layer and a third planarization layer. The circuit structure layer is located on a side of the second base proximate to the liquid crystal layer, and the third planarization layer is located on a side of the circuit structure layer proximate to the liquid crystal layer and covers the circuit structure layer. A material of the third planarization layer is the same as the material of the first planarization layer.

In some embodiments, the third planarization layer also serves as a second alignment film.

In some embodiments, the liquid crystal display panel further includes a second alignment film. The second alignment film is located between the third planarization layer and the liquid crystal layer.

In another aspect, a method of manufacturing a liquid crystal display panel is provided. The method includes: forming a first substrate and a second substrate; assembling the first substrate and the second substrate to form the liquid crystal display panel, the liquid crystal display panel further including a liquid crystal layer between the first substrate and the second substrate. A step of forming the first substrate includes: forming a color filter layer and a first planarization layer on a first base in sequence. A material of the first planarization layer includes a resin mixture containing polyimide.

In some embodiments, a step of forming the first planarization layer includes: forming a film layer on a side of the color filter layer away from the first base; performing photolithography, exposure, development and baking on the film layer to form the first planarization layer. A material of the film layer includes a resin mixture solution containing polyimide and/or polyamic acid.

In some embodiments, a temperature of the baking is in a range from 200° C. to 230° C., and a duration of the baking is 30 min.

In some embodiments, before the baking, the step further includes: performing prebaking on a developed film layer.

In some embodiments, a temperature of the prebaking is in a range from 90° C. to 120° ° C., and a duration of the prebaking is in a range from 100 s to 200 s.

In yet another aspect, a display apparatus is provided. The display apparatus includes the liquid crystal display panel as described in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
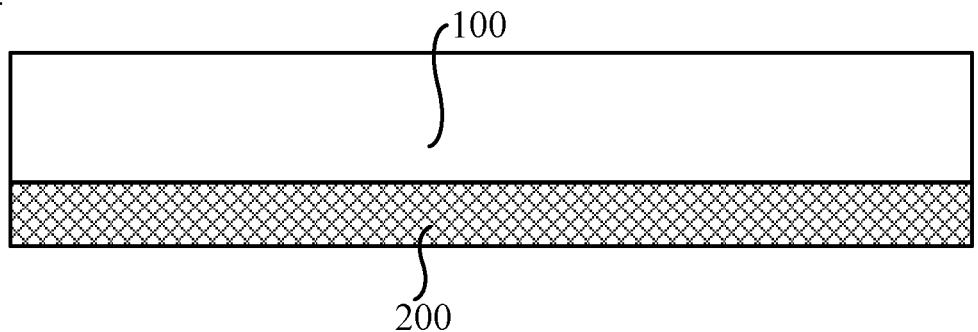
FIG. 1 is a structural diagram of a display apparatus, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" and "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the term "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "configured to" as used herein indicates an open and inclusive expression, which does not exclude devices that are applicable to or configured to perform additional tasks or steps.

Additionally, the phase "based on" as used herein is meant to be open and inclusive, since a process, step, a calculation or other action that is "based on" one or more of the stated conditions or values may, in practice, be based on additional conditions or values beyond those stated.

As used herein, the term such as "approximately" or "substantially" includes a stated value and an average value within an acceptable range of deviation of a particular value determined by a person of ordinary skill in the art, considering measurement in question and errors associated with measurement of a particular quantity (i.e., limitations of a measurement system).

As used herein, the term such as "perpendicular" or "equal" includes a stated condition and a condition similar to the stated condition, a range of the similar condition is within an acceptable range of deviation, and the acceptable range of deviation is determined by a person of ordinary skill in the art, considering measurement in question and errors associated with measurement of a particular quantity (i.e., limitations of a measurement system). For example, the term "perpendicular" includes absolute perpendicularity and approximate perpendicularity, and an acceptable deviation range of the approximate perpendicularity may also be, for example, a deviation within 5°. The term "equal" includes absolute equality and approximate equality, and an acceptable deviation range of the approximate equality may be that, for example, a difference between the two that are equal is less than or equal to 5% of either of the two.

Exemplary embodiments are described herein with reference to sectional views and/or plan views as idealized exemplary drawings. In the drawings, thicknesses of layers and regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

In addition, liquid crystal display panels shown in the exemplary drawings of the present disclosure are all in a state of no voltage applied. It will be understood that, after a voltage is applied to the liquid crystal display panel, at least part of liquid crystal molecules in the liquid crystal display panel will be deflected, thereby achieving an image display function.

Some embodiments of the present disclosure provide a display apparatus 1000. The display apparatus 1000 may be, for example, a liquid crystal display (LCD) apparatus.

It will be understood that, the display apparatus 1000 may be any apparatus that displays an image whether in motion (e.g., a video) or stationary (e.g., a still image), and whether textual or graphical. More specifically, the display apparatus 1000 may be provided in a variety of electronic apparatuses or associated with a variety of electronic apparatuses. The variety of electronic apparatuses are, but are not limited to, mobile phones, wireless apparatuses, personal data assistants (PDAs), hand-held or portable computers, GPS receivers/navigators, cameras, MP4 video players, video cameras, game consoles, watches, clocks, calculators, television monitors, flat panel displays, computer monitors, automobile displays (e.g., odometer displays, etc.), navigators, cockpit controllers and/or displays, displays of camera views (e.g., displays of rear-view cameras in vehicles), electronic photos, electronic billboards or signs, projectors, building structures, packaging and aesthetic structures (e.g., displays for displaying an image of a piece of jewelry), etc.

Referring to FIG. 1, the display apparatus 1000 may include, for example, a liquid crystal display panel 100 and a backlight module 200. The backlight module 200 is configured to provide a light source used for display for the liquid crystal display panel 100.

Some embodiments of the present disclosure provide a liquid crystal display panel 100. It will be easily understood that the liquid crystal display panel 100 may be applied to the display apparatus 1000 mentioned above. Of course, the liquid crystal display panel 100 may be applied to other apparatuses, which is not limited in the embodiments of the present disclosure.

Figure 2:
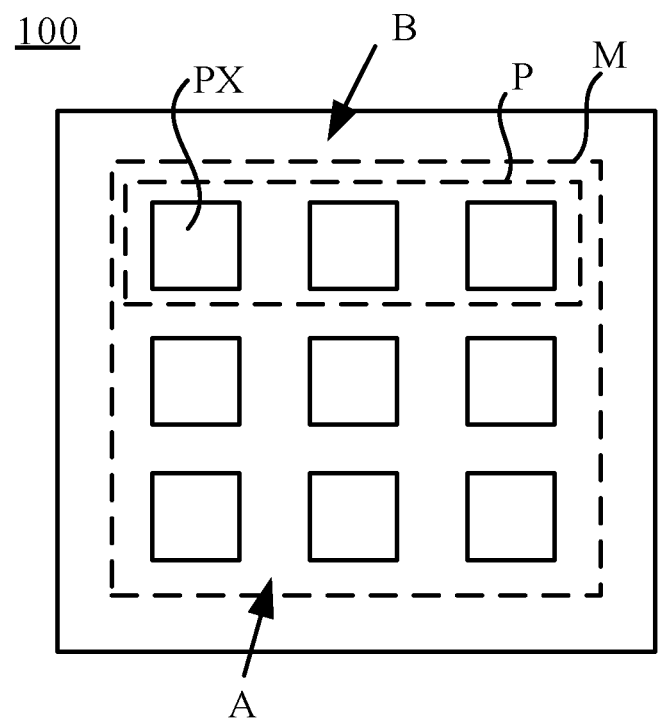
FIG. 2 is a top view of a liquid crystal display panel, in accordance with some embodiments of the present disclosure.
Figure 3:
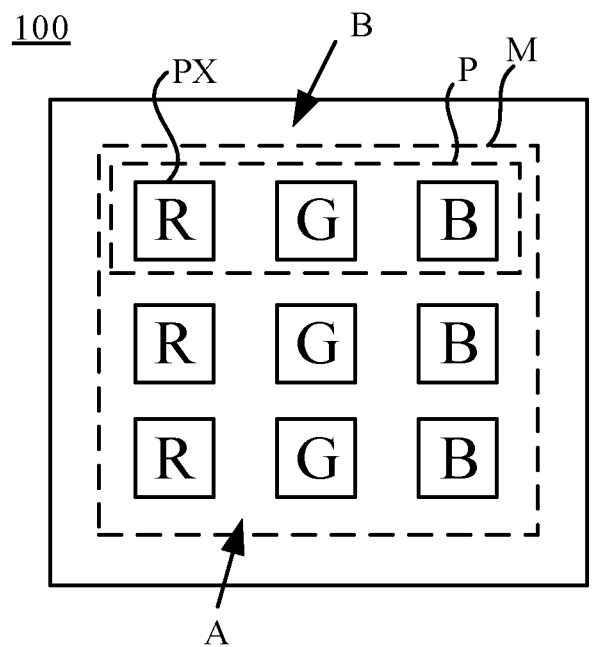
FIG. 3 is a top view of another liquid crystal display panel, in accordance with some embodiments of the present disclosure.

Referring to FIGS. 2 and 3, the liquid crystal display panel 100 has a display area A located inside a dashed box M and a peripheral area B located outside the dashed box M. A portion of the liquid crystal display panel 100 located in the display area A can display images.

It will be noted that the embodiments of the present disclosure does not limit the setting position of the peripheral area B. For example, the peripheral area B may be located on a single side, two sides or three sides of the display area A. For another example, the peripheral area B may surround the display area A.

In some examples, with continued reference to FIGS. 2 and 3, the liquid crystal display panel 100 includes a plurality of pixel regions P, and each pixel region P includes at least three sub-pixel regions PX.

It will be noted that arrangement manners of the plurality of pixel regions P may vary. For example, as shown in FIGS. 2 and 3, the plurality of pixel regions P are all located in the display area A.

For example, the sub-pixel regions PX in each pixel region P include at least one sub-pixel region of a first color, at least one sub-pixel region of a second color and at least one sub-pixel region of a third color. The first color, the second color and the third color are three primary colors.

For example, referring to FIG. 3, the sub-pixel regions PX in each pixel region P include a red sub-pixel region R, a green sub-pixel region G and a blue sub-pixel region B.

Figure 4:
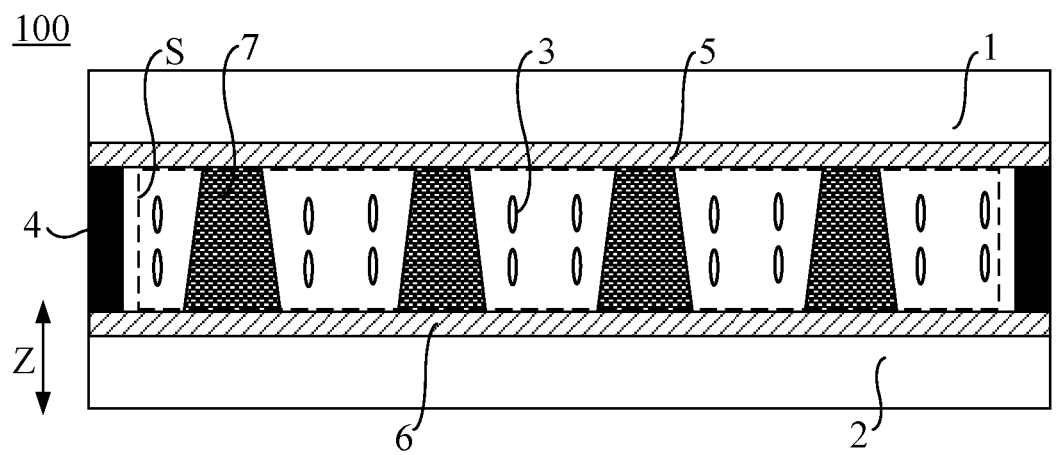
FIG. 4 is a partial structural diagram of a liquid crystal display panel, in accordance with some embodiments of the present disclosure.

In some embodiments, referring to FIG. 4, the liquid crystal display panel 100 includes a first substrate 1 and a second substrate 2 that are disposed opposite to each other, and a liquid crystal layer 3 located between the first substrate 1 and the second substrate 2. The first substrate 1 and the second substrate 2 may be adhered together, for example, by a sealant 4, so that liquid crystal molecules in the liquid crystal layer 3 are limited in a region surrounded by the sealant 4.

It will be noted that one of the first substrate 1 and the second substrate 2 is an array substrate, and the other thereof is an opposite substrate.

In some examples, with continued reference to FIG. 4, the liquid crystal display panel 100 further includes a first alignment film 5 and a second alignment film 6. The first alignment film 5 is located between the first substrate 1 and the liquid crystal layer 3, and the second alignment film 6 is located between the second substrate 2 and the liquid crystal layer 3.

With this design, the first alignment film 5 may generate anchoring force with liquid crystal molecules in the liquid crystal layer 3 that are proximate to the first alignment film 5, so as to enable these liquid crystal molecules to have pretilt angles, thereby controlling initial orientations of these liquid crystal molecules. Similarly, the second alignment film 6 may generate anchoring force with liquid crystal molecules in the liquid crystal layer 3 that are proximate to the second alignment film 6, so as to enable these liquid crystal molecules to have pretilt angles, thereby controlling initial orientations of these liquid crystal molecules.

For example, a thickness of the first alignment film 5 is tens of nanometers.

It will be noted that, as shown in FIG. 4, the thickness of the first alignment film 5 may be, for example, a dimension of the first alignment film 5 in a direction Z perpendicular to a plane where the first substrate 1 is located.

For example, a material of the first alignment film 5 may be polyimide.

With this design, since polyimide has an ability of alignment, the first alignment film 5 is able to generate the anchoring force with the liquid crystal molecules in the liquid crystal layer 3 that are proximate to the first alignment film 5.

For example, a thickness of the second alignment film 6 is tens of nanometers.

It will be noted that the thickness of the second alignment film 6 may be, for example, a dimension of the second alignment film 6 in the direction Z perpendicular to the plane where the first substrate 1 is located.

For example, a material of the second alignment film 6 may be polyimide.

With this design, since polyimide has the ability of alignment, the second alignment film 6 is able to generate the anchoring force with the liquid crystal molecules in the liquid crystal layer 3 that are proximate to the second alignment film 6.

In some examples, with continued reference to FIG. 4, the liquid crystal display panel 100 further includes spacers 7. The spacers 7 are located between the first substrate 1 and the second substrate 2, and are disposed in a same layer as the liquid crystal layer 3.

With this design, it may be possible to ensure that the liquid crystal display panel 100 maintains a certain cell gap when it is extruded by external force; furthermore, it may be possible to ensure that the first substrate 1 and the second substrate 2 are completely aligned in a process of assembling, so as to ensure an accuracy of the assembling.

It will be noted that the spacers 7 are disposed in the same layer as the liquid crystal layer 3, for example, which may refer to that the liquid crystal molecules in the liquid crystal layer 3 and the spacers 7 are all distributed in a preset region S as shown in FIG. 4. That is, the liquid crystal layer 3 and the spacers 7 have an approximately equal height and an approximately equal thickness.

The height of the liquid crystal layer 3 may be, for example, a vertical distance from a surface of the liquid crystal layer 3 away from the second substrate 2 to the second substrate 2. Similarly, the height of the spacer 7 may be, for example, a vertical distance from a surface of the spacer 7 away from the second substrate 2 to the second substrate 2.

The thickness of the liquid crystal layer 3 may be, for example, a dimension of the liquid crystal layer 3 in the direction Z perpendicular to the plane where the first substrate 1 is located. Similarly, the thickness of the spacer 7 may be, for example, a dimension of the spacer 7 in the direction Z perpendicular to the plane where the first substrate 1 is located.

Hereinafter, in the embodiments of the present disclosure, a structure of the liquid crystal display panel 100 is described by taking an example where the first substrate 1 is the opposite substrate and the second substrate 2 is the array substrate.

Figure 5:
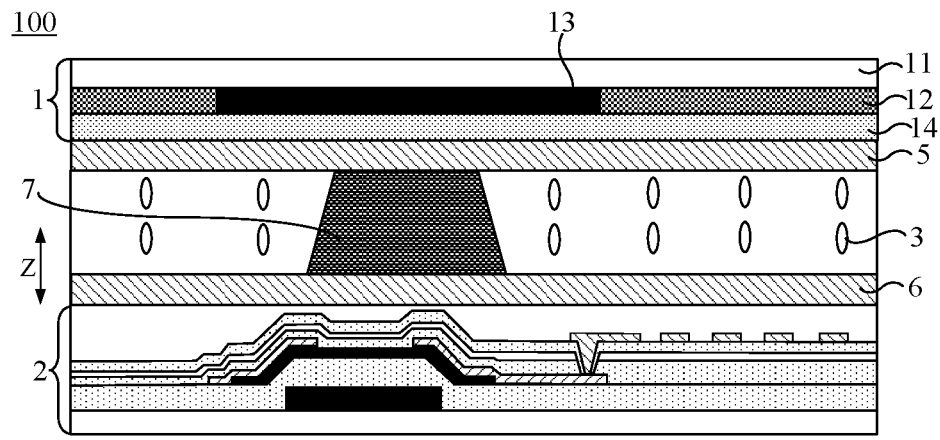
FIG. 5 is a partial structural diagram of another liquid crystal display panel, in accordance with some examples.

In some embodiments, referring to FIG. 5, the first substrate 1 includes a first base 11, and a color filter layer 12 located on a side of the first base 11 proximate to the second substrate 2. In this case, the first substrate 1 (i.e., the opposite substrate) may also be referred to as a color filter substrate.

In some examples, the color filter layer 12 includes a plurality of photoresist units of the first color, a plurality of photoresist units of the second color and a plurality of photoresist units of the third color.

A photoresist unit of the first color corresponds to a sub-pixel region of the first color; a photoresist unit of the second color corresponds to a sub-pixel region of the second color; and a photoresist unit of the third color corresponds to a sub-pixel region of the third color.

On this basis, with continued reference to FIG. 5, the first substrate 1 may further include a black matrix 13. The black matrix 13 is configured to space the photoresist units of the first color, the photoresist units of the second color and the photoresist units of the third color, so as to avoid mutual interference of light rays emitted from adjacent sub-pixel regions PX.

For example, with continued reference to FIG. 5, an orthographic projection of the spacer 7 on the first base 11 is located within an orthographic projection of the black matrix 13 on the first base 11.

With this design, it is possible to prevent the spacers 7 from blocking light rays, thereby further improving an aperture ratio of the liquid crystal display panel 100.

In some examples, with continued reference to FIG. 5, the first substrate 1 further includes a planarization layer 14. The planarization layer 14 is located on a side of the color filter layer 12 proximate to the liquid crystal layer 3 and covers the color filter layer 12.

In some of the above examples, the planarization layer 14 is able to separate the color filter layer 12 and the liquid crystal layer 3, so as to prevent ions in the color filter layer 12 from overflowing to the liquid crystal layer 3 after being affected by light to damage the liquid crystal molecules in the liquid crystal layer 3; furthermore, the planarization layer 14 is able to planarize the color filter layer 12 and reduce a level difference thereof, thereby reducing a difficulty of manufacturing subsequent film layers.

For example, a thickness of the planarization layer 14 may be in a range from 1.2 μm to 1.8 μm.

It will be noted that the thickness of the planarization layer 14 may be, for example, a dimension of the planarization layer 14 in the direction Z perpendicular to the plane where the first base 11 is located.

With this design, it may be possible to ensure that the planarization layer 14 is able to planarize the color filter layer 12 and reduce the level difference thereof, so as to further reduce the difficulty of manufacturing the subsequent film layers.

It will be noted that a material of the planarization layer 14 may be, for example, a resin. The resin may be, for example, an acrylic resin.

In this regard, since a formation of each film layer requires steps of coating, photolithography, exposure, development and baking, the material of the planarization layer 14 will be subjected to the baking when forming the planarization layer 14 or forming other film layers after the planarization layer 14 is formed. That is, the material of the planarization layer 14 will be subjected to the baking more than once. On this basis, if the acrylic resin serves as the main material of the planarization layer 14, since the acrylic resin has poor heat resistance, transmittances of the planarization layer 14 for light rays in a visible range may be significantly decreased after being subjected to the baking more than once, thereby affecting the color temperature and the contrast of the liquid crystal display panel 100 during display, and then reducing the display effect of the liquid crystal display panel 100.

In some implementations of the present disclosure, polyimide is used as the main material of the planarization layer 14 to solve the above problem. However, the effects of making the color filter layer 12 planar and reducing the level difference thereof may not be good due to the great thickness of the planarization layer 14 and a poor fluidity of the polyimide. In addition, if the thickness of the planarization layer 14 is reduced, it may not be possible to ensure that the planarization layer 14 is able to planarize the color filter layer 12 and reduce the segment difference thereof.

On this basis, some embodiments of the present disclosure provide a liquid crystal display panel 100. Referring to FIGS. 6 to 12, the liquid crystal display panel 100 includes a first substrate 1 and a second substrate 2 that are disposed opposite to each other, and a liquid crystal layer 3 located between the first substrate 1 and the second substrate 2. The first substrate 1 includes a first base 11, and a color filter layer 12 and a first planarization layer 15 that are formed on the first base 11 in sequence. The first planarization layer 15 covers the color filter layer 12, and a material of the first planarization layer 15 includes a resin mixture containing polyimide.

It will be noted that the resin mixture containing polyimide refers to a mixture of a plurality of resins, and one of the plurality of resins is polyimide. The plurality of resins may refer to, for example, two or more types of resins.

In some of the above embodiments, the first planarization layer 15 is able to planarize the color filter layer 12 and reduce a level difference thereof, thereby reducing a difficulty of manufacturing subsequent film layers.

Figure 13:
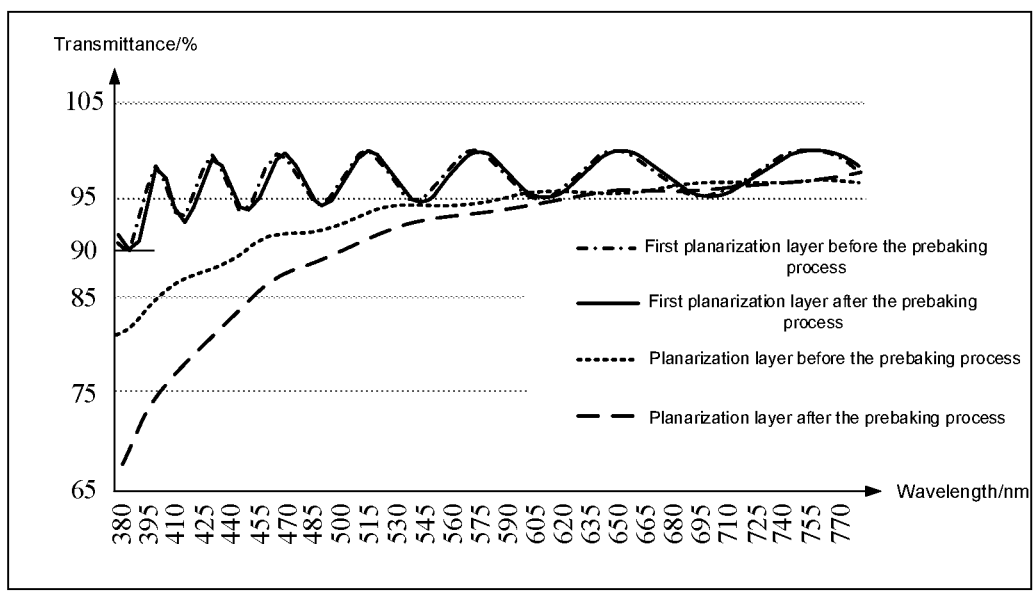
FIG. 13 is a comparison diagram showing changes in transmittance of a first planarization layer provided in some embodiments of the present discloser and a planarization layer provided in some implementations of the present disclosure, for any light ray in a visible range, before and after a preset baking process.

In addition, refer to FIG. 13, transmittances of the planarization layer 14, provided in some implementations of the present disclosure, for light rays in a range from 380 nm to 620 nm are significantly decreased after being subjected to a preset baking process with a temperature of 250° C. and a duration of 2 h, and the transmittance of the planarization layer 14 for a light ray with a wavelength of 380 nm is decreased the most (which is decreased from approximately 82% to approximately 65%). However, transmittances of the first planarization layer 15, provided in some embodiments of the present disclosure, for the light rays in the visible range are stably maintained after being subjected to the preset baking process with the temperature of 250° C. and the duration of 2 h, the transmittance of the first planarization layer 15 for any light ray in the visible range may be maintained at a level of above approximately 90%, and an average value of the transmittances of the first planarization layer 15 for the light rays in the visible range may even be maintained at a level of above approximately 93%.

In conclusion, the material of the first planarization layer 15 provided by some embodiments of the present disclosure additionally includes polyimide with high heat resistance and high transmissions for light rays on the basis of including other resins (e.g., the acrylic resin) to ensure a fluidity of the material of the first planarization layer 15, so as to improve heat resistance of the material of the first planarization layer 15. In this way, in a process of manufacturing the liquid crystal display panel 100, the material of the first planarization layer 15 may still maintain stable and excellent transmittances for the light rays in the visible range after being subjected to baking more than once, so that the color temperature and the contrast of the liquid crystal display panel 100 during display are improved. As a result, the display effect of the liquid crystal display panel 100 is improved.

In some examples, the resin mixture containing the polyimide further contains an acrylic resin.

For example, the resin mixture is composed of polyimide and the acrylic resin.

In some of the above examples, the acrylic resin is introduced into the material of the first planarization layer 15, so that the fluidity of the material of the first planarization layer 15 may be ensured; furthermore, the acrylic resin and polyimide are both serve as the main material of the first planarization layer 15, so that the heat resistance of the material of the first planarization layer 15 may be further improved by a synergistic effect of acrylic resin monomers and polyimide monomers, so as to enable the material of the first planarization layer 15 to better maintain the stable and excellent transmittances for the light rays in the visible range after being subjected to the baking more than once. As a result, the color temperature and the contrast of the liquid crystal display panel 100 during display are further improved, thereby further improving the display effect of the liquid crystal display panel 100.

In some examples, the transmittance of the first planarization layer 15 for any light ray in the visible range is greater than or equal to 90%.

In some of the above examples, the transmittance of the first planarization layer 15 for any light ray in the visible range may be controlled to be greater than or equal to 90% by, for example, introducing other resins (e.g., the acrylic resin) and polyimide into the material of the first planarization layer 15, which may improve the color temperature of the liquid crystal display panel 100 during display.

In some examples, a birefringence of the first planarization layer 15 for any light ray in the visible range is less than or equal to 0.002.

For example, the birefringence of the first planarization layer 15 for any light ray in the visible range is in a range from 0.001 to 0.002.

In some of the above examples, the birefringence of the first planarization layer 15 for any light ray in the visible range may be controlled to be less than or equal to 0.002 by, for example, introducing other resins (e.g., the acrylic resin) and polyimide into the material of the first planarization layer 15, which may reduce the birefringence of the light ray in the visible range, so as to reduce an influence on the light path and reduce scattering and reflection of the light ray, thereby further improving the display effect of the liquid crystal display panel 100.

In some examples, a thickness of the first planarization layer 15 may be in a range from 1.2 μm to 1.8 μm.

It will be noted that the thickness of the first planarization layer 15 may be, for example, a dimension of the first planarization layer 15 in the direction Z perpendicular to the plane where the first base 11 is located.

With this design, it may be possible to better ensure that the first planarization layer 15 is able to planarize the color filter layer 12 and reduce the level difference thereof, so as to further reduce the difficulty of manufacturing the subsequent film layers.

Figure 6:
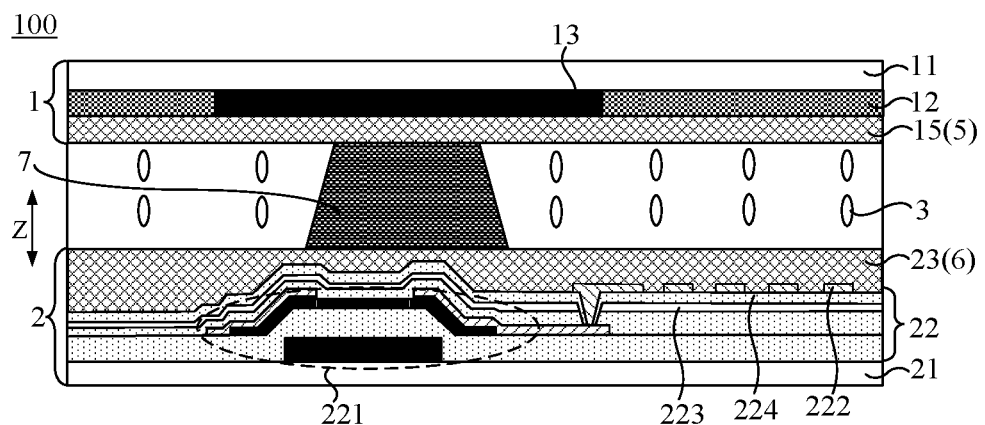
FIG. 6 is a partial structural diagram of yet another liquid crystal display panel, in accordance with some embodiments of the present disclosure.
Figure 8:
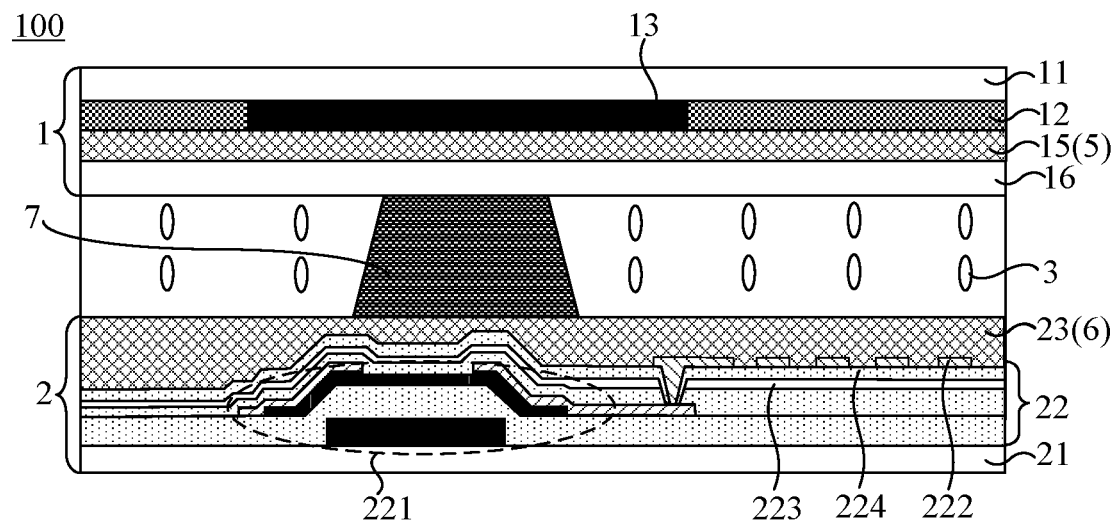
FIG. 8 is a partial structural diagram of yet another liquid crystal display panel, in accordance with some embodiments of the present disclosure.

In some examples, referring to FIGS. 6 and 8, the first planarization layer 15 also serves as the first alignment film 5.

It will be noted that polyimide further has an alignment ability; thus, in some of the above examples, the first planarization layer 15 have the alignment ability by introducing polyimide with the high heat resistance and the high transmissions for light rays into the material of the first planarization layer 15, so that the first planarization layer 15 may also serve as the first alignment film 5. That is, the first planarization layer 15 and the liquid crystal molecules in the liquid crystal layer 3 are in contact with each other, and the first planarization layer 15 may generate anchoring force with liquid crystal molecules proximate thereto, so as to enable these liquid crystal molecules to have pretilt angles, thereby controlling initial orientations of these liquid crystal molecules. In this way, not only may the liquid crystal display panel 100 be made lighter and thinner, but also may the process of manufacturing the liquid crystal display panel 100 be simplified and the manufacturing costs be saved.

Figure 7:
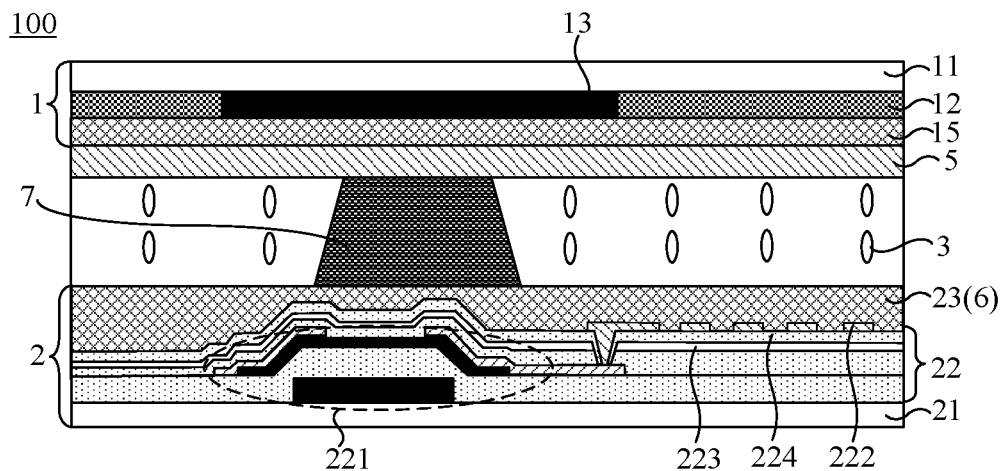
FIG. 7 is a partial structural diagram of yet another liquid crystal display panel, in accordance with some embodiments of the present disclosure.

In some other examples, referring to FIG. 7, the first alignment film 5 is located between the first planarization layer 15 and the liquid crystal layer 3.

In some of the above examples, the first planarization layer 15 is mainly used to planarize the color filter layer 12 and reduce the level difference thereof, so as to reduce the difficulty of manufacturing the subsequent film layers; the first alignment film 5 is mainly used to generate anchoring force with liquid crystal molecules proximate thereto, so as to enable these liquid crystal molecules to have pretilt angles, thereby controlling initial orientations of these liquid crystal molecules.

In addition, it will be noted that compared with the implementation of replacing the first planarization layer 15 by the planarization layer 14 on the basis of the liquid crystal display panel 100 as shown in FIG. 7, in a case where gray-scale brightness includes L0 to L255, the color temperature is increased by 3.14% and the contrast is increased by 5.33% when the liquid crystal display panel 100 as shown in FIG. 7 is performing display. The color temperature is measured in a case where the grey-scale brightness is L255, and the contrast is a ratio of the grey-scale brightness of L255 to the grey-scale brightness of L0.

In some embodiments, referring to FIGS. 8 to 12, the first substrate 1 further includes a first optical compensation layer 16 located on a side of the first planarization layer 15 proximate to the liquid crystal layer 3.

In some of the above embodiments, by providing the first optical compensation layer 16, it is possible to compensate for a change in a polarization state of the light ray caused by the liquid crystal layer 3, so that light ray emitted from the first optical compensation layer 16 is still a linearly polarized light ray. As a result, problems of light leakage and color cast of the liquid crystal display panel 100 are ameliorated.

It will be noted that types of the first optical compensation layer 16 may vary.

In some examples, the first optical compensation layer 16 includes an anisotropic crystal layer having at least one optical axis.

For example, the first optical compensation layer 16 is a uniaxial optical compensation layer having only a single optical axis. On this basis, for example, the first optical compensation layer 16 is a +A compensation film layer.

In this case, the first optical compensation layer 16 may satisfy that $n_{x1}$ is larger than $n_{y1}$, and $n_{y1}$ is approximately equal to $n_{z1}$ ($n_{x1}>n_{y1}\approx n_{z1}$) or satisfy that $n_{x1}$ is larger than $n_{y1}$, and $n_{y1}$ is equal to $n_{z1}$ ($n_{x1}>n_{y1}=n_{z1}$); $n_{x1}$ is an in-plane refraction index of the first optical compensation layer 16 in a direction of an X1 axis, $n_{y1}$ is an in-plane refraction index of the first optical compensation layer 16 in a direction of a Y1 axis that is perpendicular to the X1 axis, and $n_{z1}$ is a refraction index of the first optical compensation layer 16 in a thickness direction Z1 thereof. The X1 axis is the optical axis of the first optical compensation layer 16. It will be noted that in a case where there is a relatively small tilt angle (e.g., a tilt angle within 5°) between the X1 axis and the first optical compensation layer 16, the X1 axis may also be considered to be located in a plane of the first optical compensation layer 16. It will be understood that in the case where there is the relatively small tilt angle between the X1 axis and the first optical compensation layer 16, there will be a certain difference between $n_{y1}$ and $n_{z1}$. In view of the above situation, $n_{y1}$ may be equal or approximately equal to $n_{z1}$.

With this design, the +A compensation film layer is located between the first substrate 1 and the second substrate 2, and the optical axis of the +A compensation film layer is parallel to optical axes of liquid crystal molecules that are proximate to the +A compensation film layer of the liquid crystal layer 3, thus the +A compensation film layer has an effect of positive compensation, which may counteract phase retardation of the liquid crystal layer 3 for polarized light and compensate for the change in the polarization state of the light caused by the liquid crystal layer 3, so that the light emitted from the +A compensation film layer is still the linearly polarized light. As a result, the problems of the light leakage and the color cast of the liquid crystal display panel 100 are ameliorated.

In some embodiments, referring to FIGS. 9 to 12, the first substrate 1 further includes a second planarization layer 17 located on a side of the first optical compensation layer 16 proximate to the liquid crystal layer 3.

In some of the above embodiments, the second planarization layer 17 is able to planarize the first optical compensation layer 16 and reduce a level difference thereof, thereby reducing a difficulty of manufacturing subsequent film layers.

In some examples, a material of the second planarization layer 17 is the same as the material of the first planarization layer 15.

In some of the above examples, the material of the second planarization layer 17 is controlled to be the same as the material of the first planarization layer 15, so as to further improve, by using polyimide with the high heat resistance and the high transmissions for light rays, heat resistance of the material of the second planarization layer 17 on the basis of ensuring a fluidity of the second planarization layer 17 by using other resins (e.g., the acrylic resin). In this way, in the process of manufacturing the liquid crystal display panel 100, the material of the second planarization layer 17 may still maintain stable and excellent transmittances for the light rays in the visible range after being subjected to the baking more than once, so as to improve the color temperature and the contrast of the liquid crystal display panel 100 during display, thereby improving the display effect of the liquid crystal display panel 100.

Figure 9:
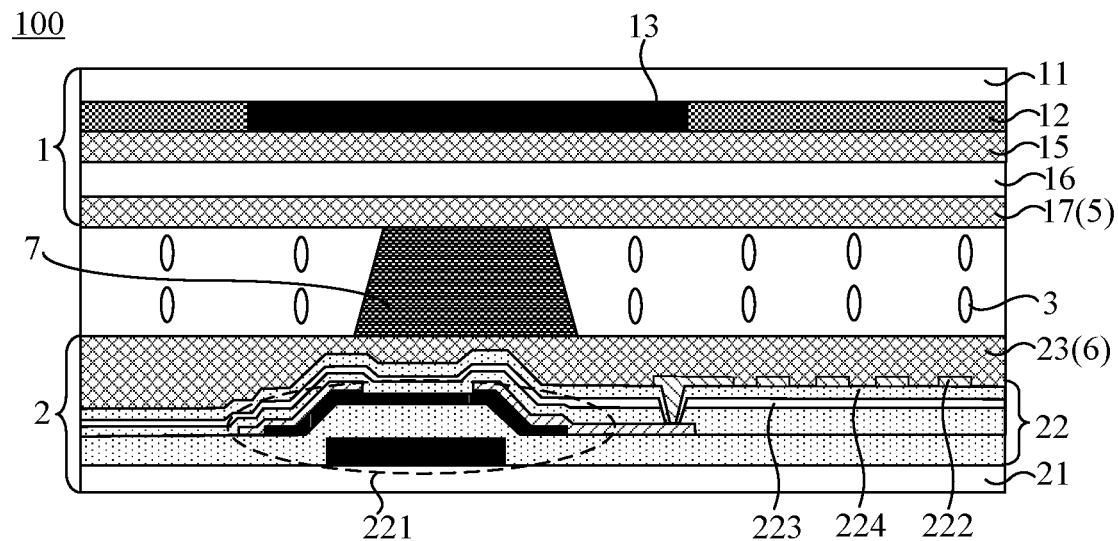
FIG. 9 is a partial structural diagram of yet another liquid crystal display panel, in accordance with some embodiments of the present disclosure.
Figure 11:
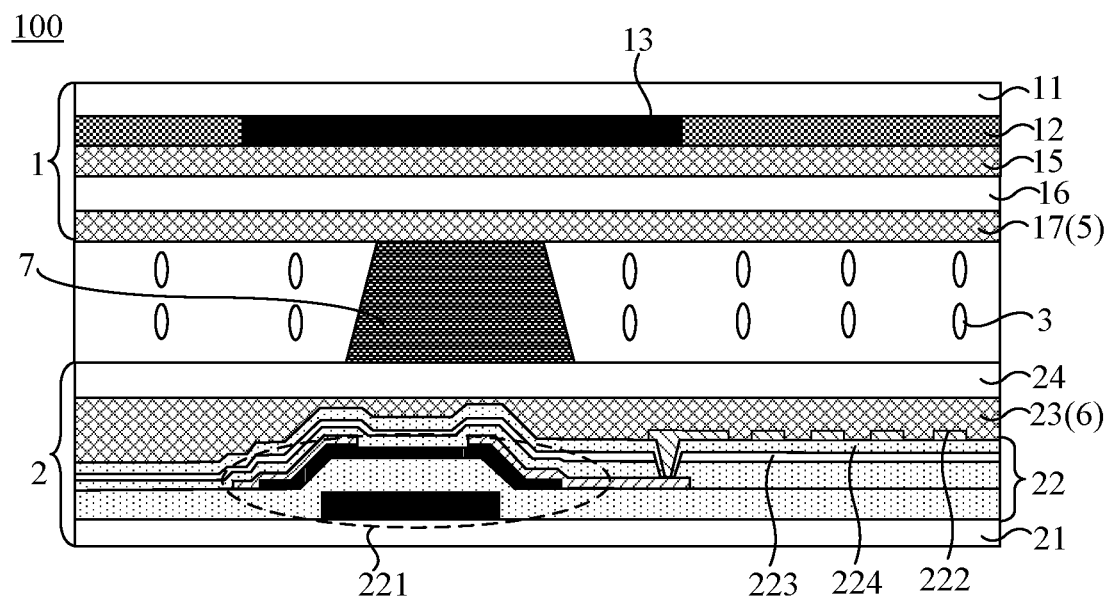
FIG. 11 is a partial structural diagram of yet another liquid crystal display panel, in accordance with some embodiments of the present disclosure.
Figure 12:
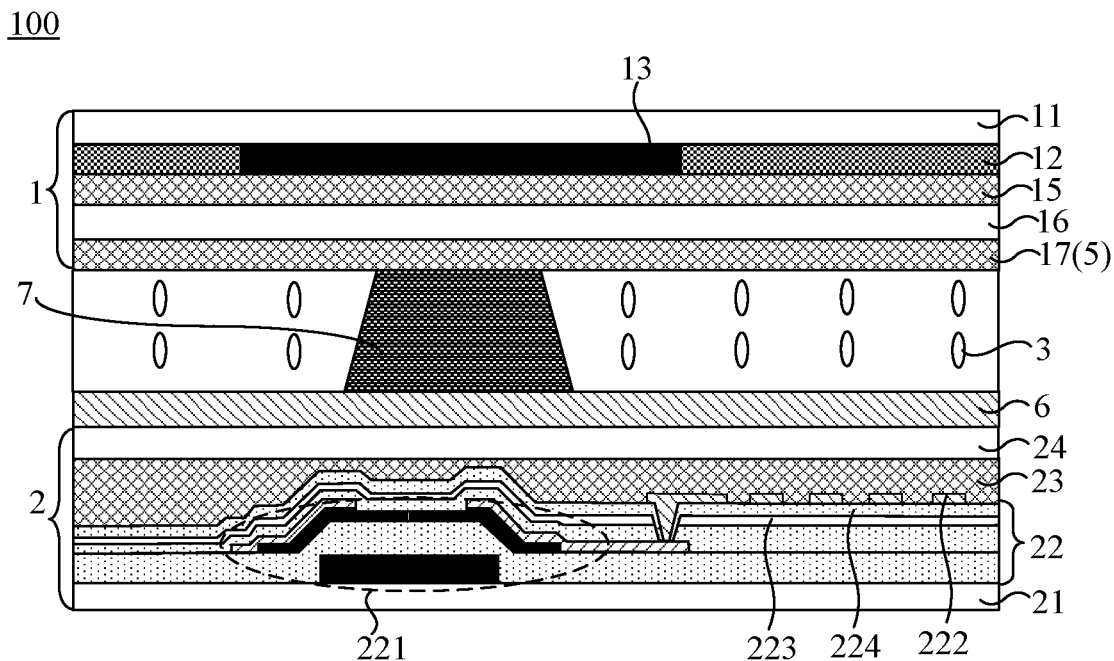
FIG. 12 is a partial structural diagram of yet another liquid crystal display panel, in accordance with some embodiments of the present disclosure.

For example, referring to FIGS. 9, 11 and 12, the second planarization layer 17 also serves as the first alignment film 5.

It will be noted that polyimide further has the alignment ability. Therefore, in some of the above examples, the second planarization layer 17 has the alignment ability by introducing polyimide with the high heat resistance and the high transmissions for light rays into the material of the second planarization layer 17, so that the second planarization layer 17 may also serve as the first alignment film 5. That is, the second planarization layer 17 and the liquid crystal molecules in the liquid crystal layer 3 are in contact with each other, and the second planarization layer 17 may generate anchoring force with liquid crystal molecules proximate thereto, so as to enable these liquid crystal molecules to have pretilt angles, thereby controlling initial orientations of these liquid crystal molecules. In this way, not only may the liquid crystal display panel 100 be made lighter and thinner, but also may the process of manufacturing the liquid crystal display panel 100 be simplified and the manufacturing costs be saved.

Figure 10:
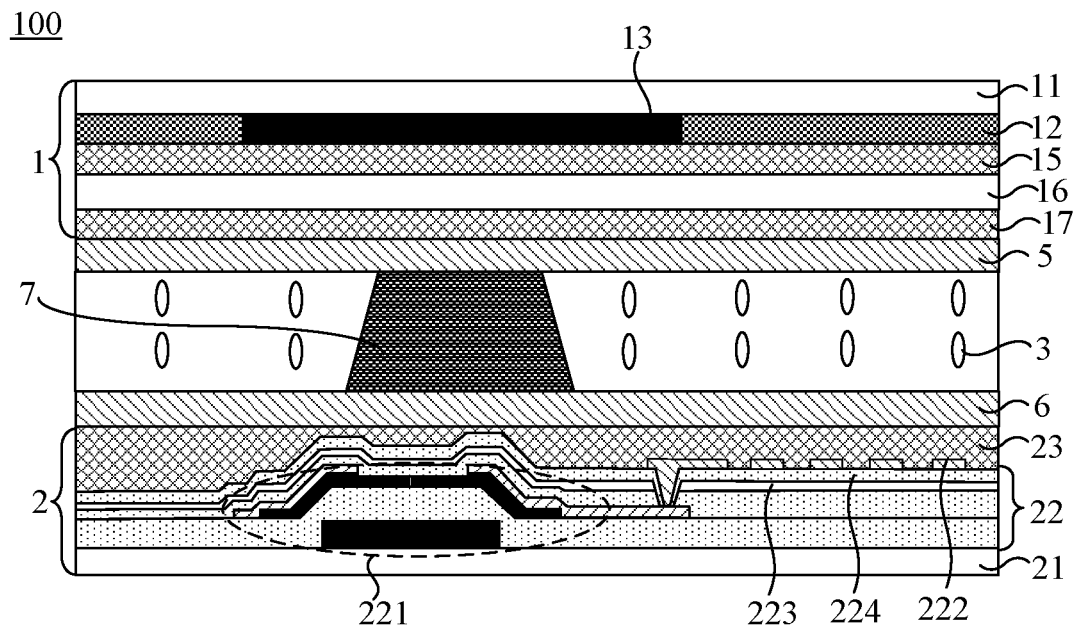
FIG. 10 is a partial structural diagram of yet another liquid crystal display panel, in accordance with some embodiments of the present disclosure.

For another example, referring to FIG. 10, the first alignment film 5 is located between the second planarization layer 17 and the liquid crystal layer 3.

Here, it will be noted that the second planarization layer 17 is mainly used to planarize the first optical compensation layer 16 and reduce the level difference thereof, so as to reduce the difficulty of manufacturing the subsequent film layers; the first alignment film 5 is mainly used to generate the anchoring force with the liquid crystal molecules in the liquid crystal layer 3 that are proximate thereto, so as to enable these liquid crystal molecules to have the pretilt angles, thereby controlling the initial orientations of these liquid crystal molecules.

In some other examples, the material of the second planarization layer 17 is a resin, and the resin may be, for example, the acrylic resin. In this case, referring to FIG. 10, the first alignment film 5 is located between the second planarization layer 17 and the liquid crystal layer 3.

In some of the above examples, the material of the second planarization layer 17 is the resin (e.g., the acrylic resin). That is, the second planarization layer 17 has no alignment ability. In this case, in order to control the initial orientations of the liquid crystal molecules in the liquid crystal layer 3, it is necessary to extra provide the first alignment film 5 between the second planarization layer 17 and the liquid crystal layer 3 (e.g., as shown in FIG. 10), so as to enable the liquid crystal molecules proximate to the first alignment film 5 to have the pretilt angles, thereby controlling the initial orientations of these liquid crystal molecules.

It will be noted that compared with the implementation of replacing the first planarization layer 15 by the planarization layer 14 on the basis of the liquid crystal display panel 100 (the material of the second planarization layer 17 is still the same as the material of the first planarization layer 15) as shown in FIG. 10, in the case where the gray-scale brightness includes L0 to L255, the color temperature is increased by 1.78% and the contrast is increased by 3.68% when the liquid crystal display panel 100 (the material of the second planarization layer 17 is still the same as the material of the first planarization layer 15) as shown in FIG. 10 is performing display. The color temperature is measured in the case where the grey-scale brightness is L255, and the contrast is the ratio of the grey-scale brightness of L255 to the grey-scale brightness of L0.

It will be easily understood that since overall film layer structures of the liquid crystal display panel 100 may vary, degrees of increases in the color temperature and the contrast when the liquid crystal display panel 100 is performing display that are caused by replacing the planarization layer 14 by the first planarization layer 15 may vary.

In some embodiments, referring to FIGS. 6 to 12, the second substrate 2 includes a second base 21 and a circuit structure layer 22 located on a side of the second base 21 proximate to the liquid crystal layer 3.

In some examples, with continued reference to FIGS. 6 to 12, in a single sub-pixel region, the circuit structure layer 22 includes a thin film transistor 221 and a pixel electrode 222.

The thin film transistor 221 includes an active layer, a source, a drain, a gate and a gate insulating layer. The source of the thin film transistor 221 and the drain of the thin film transistor 221 are in contact with the active layer of the thin film transistor 221. The pixel electrode 222 is electrically connected to the drain of the thin film transistor 221.

For example, with continued reference to FIGS. 6 to 12, in the single sub-pixel region, the circuit structure layer 22 further includes a common electrode 223 located on the second base 21.

For example, with continued reference to FIGS. 6 to 12, the pixel electrode 222 and the common electrode 223 may be disposed in different layers. In this case, an insulating layer 224 is provided between the pixel electrode 222 and the common electrode 223.

Alternatively, the pixel electrode 222 and the common electrode 223 may be disposed in a same layer. In this case, the pixel electrode 222 and the common electrode 223 are each of a comb-tooth structure including a plurality of strip-shaped sub-electrodes.

In some embodiments, referring to FIGS. 6 to 12, the second substrate 2 further includes a third planarization layer 23 located on a side of the circuit structure layer 22 proximate to the liquid crystal layer 3.

In some of the above embodiments, the third planarization layer 21 is able to planarize the circuit structure layer 22 and reduce a level difference thereof, thereby reducing a difficulty of manufacturing subsequent film layers.

In some examples, a material of the third planarization layer 23 is the same as the material of the first planarization layer 15. In this case, referring to FIGS. 6 to 9 and 11, the third planarization layer 23 also serves as the second alignment film 6.

In some of the above examples, the material of the third planarization layer 23 is controlled to be the same as the material of the first planarization layer 15, so as to further improve, by using polyimide with the high heat resistance and the high transmissions for light rays, heat resistance of the material of the third planarization layer 23 on the basis of ensuring a fluidity of the third planarization layer 23 by using other resins (e.g., the acrylic resin). In this way, in the process of manufacturing the liquid crystal display panel 100, the material of the third planarization layer 23 may still maintain stable and excellent transmittances for the light rays in the visible range after being subjected to the baking more than once, so as to improve the color temperature and the contrast of the liquid crystal display panel 100 during display, thereby improving the display effect of the liquid crystal display panel 100.

In addition, the polyimide further has the alignment ability. Therefore, the third planarization layer 23 has the alignment ability by introducing polyimide with the high heat resistance and the high transmissions for light rays into the material of the third planarization layer 23, so that the third planarization layer 23 may also serve as the second alignment film 6. That is, the third planarization layer 23 and the liquid crystal molecules in the liquid crystal layer 3 are in contact with each other, and the third planarization layer 23 may generate anchoring force with liquid crystal molecules proximate thereto, so as to enable these liquid crystal molecules to have pretilt angles, thereby controlling initial orientations of these liquid crystal molecules. In this way, not only may the liquid crystal display panel 100 be made lighter and thinner, but also may the process of manufacturing the liquid crystal display panel 100 be simplified and the manufacturing costs be saved.

In some other examples, the material of the third planarization layer 23 is the same as the material of the first planarization layer 15. In this case, referring to FIGS. 10 and 12, the second alignment film 6 is located between the third planarization layer 23 and the liquid crystal layer 3.

In some of the above examples, the third planarization layer 23 is mainly used to planarize the circuit structure layer 22 and reduce the level difference thereof, so as to reduce the difficulty of manufacturing the subsequent film layers; the second alignment film 6 is mainly used to generate anchoring force with liquid crystal molecules in the liquid crystal layer 3 that are proximate thereto, so as to enable these liquid crystal molecules to have pretilt angles, thereby controlling initial orientations of these liquid crystal molecules.

In yet other examples, the material of the third planarization layer 23 is a resin, and the resin may be, for example, the acrylic resin. In this case, referring to FIGS. 10 and 12, the second alignment film 6 is located between the third planarization layer 23 and the liquid crystal layer 3.

It will be noted that, in a case where the material of the third planarization layer 23 is the resin (e.g., the acrylic resin), the third planarization layer 23 has no alignment ability. In this case, in order to control the initial orientations of the liquid crystal molecules in the liquid crystal layer 3, it is necessary to extra provide the second alignment film 6 between the third planarization layer 23 and the liquid crystal layer 3 (e.g., as shown in FIG. 10), so as to enable the liquid crystal molecules proximate to the second alignment film 6 to have the pretilt angles, thereby controlling initial orientations of liquid crystal molecules.

In some embodiments, referring to FIGS. 11 and 12, the second substrate 2 further includes a second optical compensation layer 24 located on a side of the third planarization layer 23 proximate to the liquid crystal layer 3.

In some of the above embodiments, by providing the second optical compensation layer 24, it is possible to compensate for a change in a polarization state of the light ray caused by the liquid crystal layer 3, so that light ray emitted from the second optical compensation layer 24 is still a linearly polarized light ray. As a result, the problems of the light leakage and the color cast of the liquid crystal display panel 100 are ameliorated.

It will be noted that the arrangement of the second optical compensation layer 24 includes, but is not limited to, the following examples.

For example, in a case where the material of the third planarization layer 23 is the same as the material of the first planarization layer 15, and the third planarization layer 23 also serves as the second alignment film 6, referring to FIG. 11, the second optical compensation layer 24 is located between the third planarization layer 23 and the liquid crystal layer 3.

For another example, in a case where the material of the third planarization layer 23 is the same as the material of the first planarization layer 15, and the second alignment film 6 is located between the third planarization layer 23 and the liquid crystal layer 3, referring to FIG. 12, the second optical compensation layer 24 is located between the third planarization layer 23 and the second alignment film 6.

For yet another example, in a case where the material of the third planarization layer 23 is the resin, the resin may be, for example, the acrylic resin, and the second alignment film 6 is located between the third planarization layer 23 and the liquid crystal layer 3, referring to FIG. 12, the second optical compensation layer 24 is located between the third planarization layer 23 and the second alignment film 6.

It will be noted that types of the second optical compensation layer 24 may vary.

In some examples, the second optical compensation layer 24 includes an anisotropic crystal layer having at least one optical axis.

For example, the second optical compensation layer 24 is a uniaxial optical compensation layer having only a single optical axis. On this basis, for example, the second optical compensation layer 24 is a +A compensation film layer.

In this case, the second optical compensation layer 24 may satisfy that $n_{x2}$ is larger than $n_{y2}$, and $n_{y2}$ is approximately equal to $n_{z2}$ ($n_{x2}>n_{y2}\approx n_{z2}$) or satisfy that $n_{x2}$ is larger than $n_{y2}$, and $n_{y2}$ is equal to $n_{z2}$ ($n_{x2}>n_{y2}=n_{z2}$); $n_{x2}$ is an in-plane refraction index of the second optical compensation layer 24 in a direction of an X2 axis, $n_{y2}$ is an in-plane refraction index of the second optical compensation layer 24 in a direction of a Y2 axis that is perpendicular to the X2 axis, and $n_{z2}$ is a refraction index of the second optical compensation layer 24 in a thickness direction Z2 thereof. The X2 axis is the optical axis of the second optical compensation layer 24. It will be noted that in a case where there is a relatively small tilt angle (e.g., a tilt angle within 5°) between the X2 axis and the second optical compensation layer 24, the X2 axis may also be considered to be located in a plane of the second optical compensation layer 24. It will be understood that in the case where there is the relatively small tilt angle between the X2 axis and the second optical compensation layer 24, there will be a certain difference between $n_{y2}$ and $n_{z2}$. In view of the above situation, $n_{y2}$ may be equal or approximately equal to $n_{z2}$.

With this design, the +A compensation film layer is located between the first substrate 1 and the second substrate 2, and the optical axis of the +A compensation film layer is parallel to optical axes of liquid crystal molecules that are proximate to the +A compensation film layer of the liquid crystal layer 3, thus the +A compensation film layer has the effect of positive compensation, which may counteract the phase retardation of the liquid crystal layer 3 for the polarized light ray and compensate for the change in the polarization state of the light ray caused by the liquid crystal layer 3, so that the light ray emitted from the +A compensation film layer is still the linearly polarized light ray. As a result, the problems of the light leakage and the color cast of the liquid crystal display panel 100 are ameliorated.

Figure 14:
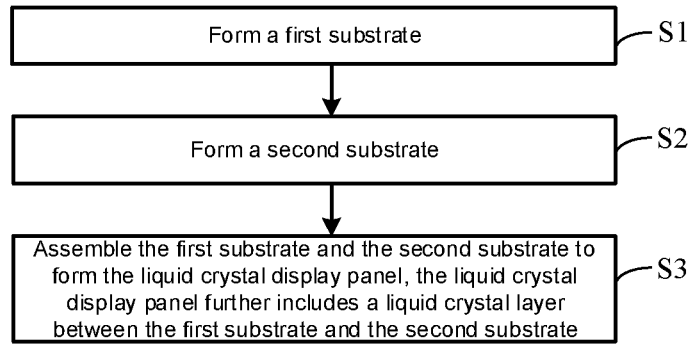
FIG. 14 is a flow diagram of a method of manufacturing a liquid crystal display panel, in accordance with some embodiments of the present disclosure.

Based on the liquid crystal display panel 100 as described in any one of the above embodiments, some embodiments of the present disclosure provide a method of manufacturing the liquid crystal display panel 100. Referring to FIG. 14, the method includes S1 to S3.

In S1, a first substrate 1 is formed.

In S2, a second substrate 2 is formed.

In S3, the first substrate 1 and the second substrate 2 are assembled to form the liquid crystal display panel 100, the liquid crystal display panel 100 further includes a liquid crystal layer 3 between the first substrate 1 and the second substrate 2.

Figure 15:
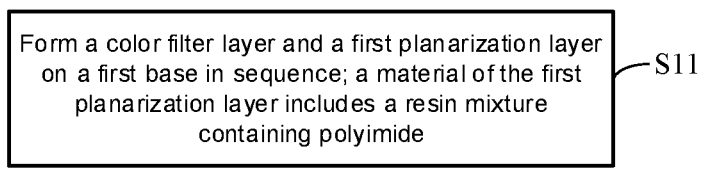
FIG. 15 is a flow diagram of a method of manufacturing another liquid crystal display panel, in accordance with some embodiments of the present disclosure.

Referring to FIG. 15, a step of forming the first substrate 1 includes S11.

In S11, a color filter layer 12 and a first planarization layer 15 are formed on a first base 11 in sequence. A material of the first planarization layer 15 includes a resin mixture containing polyimide.

It will be noted that the resin mixture containing polyimide refers to a mixture of a plurality of resins, and one of the plurality of resins is polyimide. The plurality of resins may refer to, for example, two or more types of resins.

The method of manufacturing the liquid crystal display panel 100 provided in some of the above embodiments is used to manufacture the liquid crystal display panel 100 provided in some of the foregoing embodiments, in the liquid crystal display panel 100, the first planarization layer 15 is able to planarize the color filter layer 12 and reduce a level difference thereof, thereby reducing a difficulty of manufacturing subsequent film layers.

In addition, the material of the first planarization layer 15 provided by some embodiments of the present disclosure additionally includes polyimide with high heat resistance and high transmissions for light rays on the basis of including other resins (e.g., the acrylic resin) to ensure a fluidity of this material, so as to improve heat resistance of the material of the first planarization layer 15. In this way, in the process of manufacturing the liquid crystal display panel 100, the material of the first planarization layer 15 may still maintain stable and excellent transmittances for the light rays in the visible range after being subjected to baking more than once, so that the color temperature and the contrast of the liquid crystal display panel 100 during display are improved. As a result, the display effect of the liquid crystal display panel 100 is improved.

Figure 16:
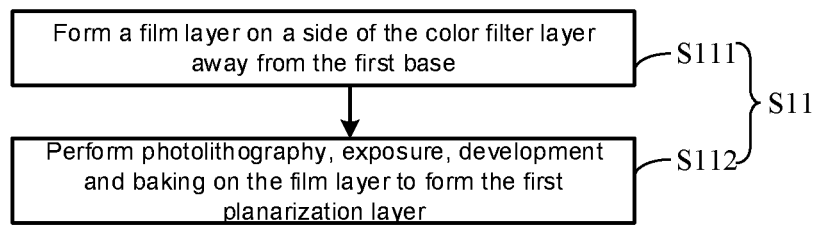
FIG. 16 is a flow diagram of a method of manufacturing yet another liquid crystal display panel, in accordance with some embodiments of the present disclosure.

In some embodiments, referring to FIG. 16, a step of forming the first planarization layer 15 includes S111 and S112.

In S111, a film layer is formed on a side of the color filter layer 12 away from the first base 11.

In S112, photolithography, exposure, development and baking are performed on the film layer to form the first planarization layer 15.

It will be noted that the method of manufacturing the liquid crystal display panel 100 provided in some of the above embodiments is used to manufacture the liquid crystal display panel 100 provided in some of the foregoing embodiments, beneficial effects of the manufactured liquid crystal display panel 100 and beneficial effects of the liquid crystal display panel 100 provided in some of the foregoing embodiments are the same, and details will not be repeated here.

In some examples, a material of the film layer includes a resin mixture solution containing polyimide. For example, the material of the film layer includes a resin mixture solution containing polyimide and an acrylic resin.

In some other examples, the material of the film layer includes a resin mixture solution containing polyamic acid. For example, the material of the film layer includes a resin mixture solution containing polyamic acid and an acrylic resin.

In yet other examples, the material of the film layer includes a resin mixture solution containing polyimide and polyamic acid. For example, the material of the film layer includes a resin mixture solution containing polyimide, polyamic acid and an acrylic resin.

It will be noted that, after the resin mixture solution containing polyimide is heated, a solvent in the solution can be removed to obtain a solid containing polyimide; after the resin mixture solution containing polyamic acid is heated, a solvent in the solution can be removed, and polyamic acid can be transform into polyimide to obtain a solid containing polyimide. Therefore, whether the material of the film layer includes the resin mixture solution containing polyimide or the resin mixture solution containing polyamic acid, the material of the first planarization layer 15 obtained by the baking includes the resin mixture containing polyimide.

For example, a temperature of the baking is in a range from 200° C. to 230° C.

For example, a duration of the baking is 30 min.

In some examples, before the baking, the method further includes: performing prebaking on a developed film layer.

For example, a temperature of the prebaking is in a range from 90° ° C. to 120° C.

For example, a duration of the prebaking is in a range from 100 s to 200 s.

It will be noted that in the step of forming the first planarization layer 15, the temperature of the prebaking is relatively low and the duration of the prebaking is relatively short, and the temperature of the baking is relatively high and the duration of the baking is relatively long. Therefore, the heat resistance of the first planarization layer 15 is mainly reflected in that the first planarization layer 15 may still maintain excellent physical and mechanical properties after being subjected to the baking.

Figure 17:
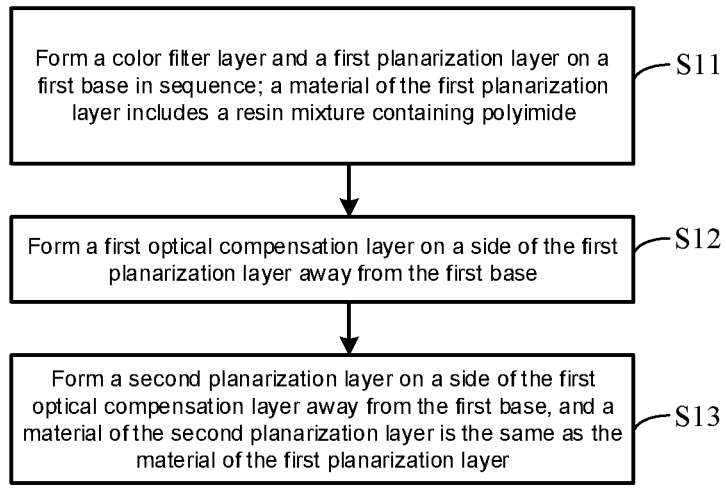
FIG. 17 is a flow diagram of a method of manufacturing yet another liquid crystal display panel, in accordance with some embodiments of the present disclosure.

In some embodiments, referring to FIG. 17, after S11, the step of forming the first substrate 1 further includes S12.

In S12, a first optical compensation layer 16 is formed on a side of the first planarization layer 15 away from the first base 11.

In some examples, a step of forming the first optical compensation layer 16 includes coating, photolithography, exposure, development, prebaking and baking.

It will be noted that the method of manufacturing the liquid crystal display panel 100 provided in some of the above embodiments is used to manufacture the liquid crystal display panel 100 provided in some of the foregoing embodiments, the beneficial effects of the manufactured liquid crystal display panel 100 and the beneficial effects of the liquid crystal display panel 100 provided in some of the foregoing embodiments are the same, and the details will not be repeated here.

For example, a temperature of the baking is in a range from 200° C. to 230° C.

For example, a duration of the baking is 30 min.

For example, a temperature of the prebaking is in a range from 90° C. to 120° C.

For example, a duration of the prebaking is in a range from 100 s to 200 s.

It will be noted that in the step of forming the first optical compensation layer 16, the temperature of the prebaking is relatively low and the duration of the prebaking is relatively short, and the temperature of the baking is relatively high and the duration of the baking is relatively long. Therefore, the heat resistance of the first planarization layer 15 is mainly reflected in that the first planarization layer 15 may still maintain the excellent physical and mechanical properties after being subjected to the baking.

In some embodiments, with continued reference to FIG. 17, after S12, the step of forming the first substrate 1 further includes S13.

In S13, a second planarization layer 17 is formed on a side of the first optical compensation layer 16 away from the first base 11, and a material of the second planarization layer 17 is the same as the material of the first planarization layer 15.

It will be noted that the method of manufacturing the liquid crystal display panel 100 provided in some of the above embodiments is used to manufacture the liquid crystal display panel 100 provided in some of the foregoing embodiments, the beneficial effects of the manufactured liquid crystal display panel 100 and the beneficial effects of the liquid crystal display panel 100 provided in some of the foregoing embodiments are the same, and the details will not be repeated here.

In some examples, a step of forming the second planarization layer 17 includes coating, photolithography, exposure, development, prebaking and baking.

For example, a temperature of the baking is in a range from 200° C. to 230° C.

For example, a duration of the baking is 30 min.

For example, a temperature of the prebaking is in a range from 90° C. to 120° C.

For example, a duration of the prebaking is in a range from 100 s to 200 s.

It will be noted that in the step of forming the second planarization layer 17, the temperature of the prebaking is relatively low and the duration of the prebaking is relatively short, and the temperature of the baking is relatively high and the duration of the baking is relatively long. Therefore, the heat resistance of the first planarization layer 15 and the second planarization layer 17 is mainly reflected in that the first planarization layer 15 and the second planarization layer 17 may each still maintain the excellent physical and mechanical properties after being subjected to the baking respectively.

Figure 18:
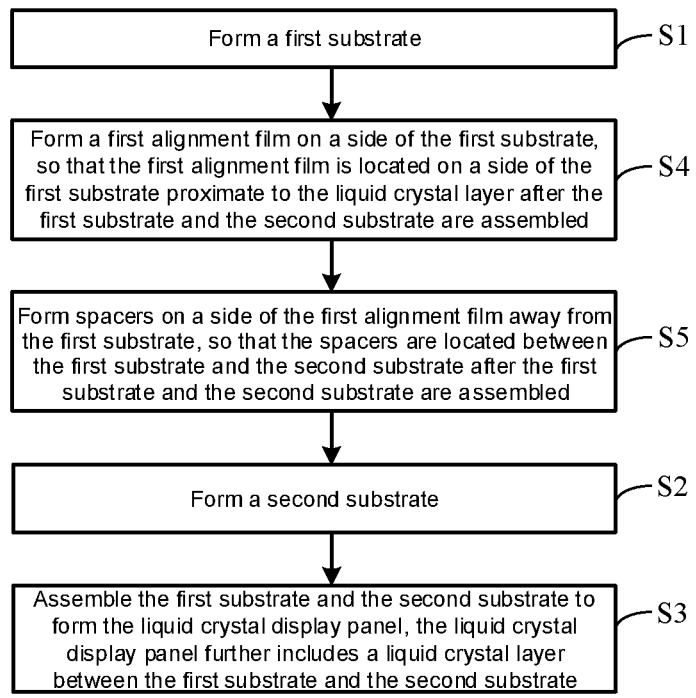
FIG. 18 is a flow diagram of a method of manufacturing yet another liquid crystal display panel, in accordance with some embodiments of the present disclosure.

In some embodiments, referring to FIG. 18, after S1, the method of manufacturing the liquid crystal display panel 100 further includes S4.

In S4, a first alignment film 5 is formed on a side of the first substrate 1, so that the first alignment film 5 is located on a side of the first substrate 1 proximate to the liquid crystal layer 3 after the first substrate 1 and the second substrate 2 are assembled.

It will be noted that the method of manufacturing the liquid crystal display panel 100 provided in some of the above embodiments is used to manufacture the liquid crystal display panel 100 provided in some of the foregoing embodiments, the beneficial effects of the manufactured liquid crystal display panel 100 and the beneficial effects of the liquid crystal display panel 100 provided in some of the foregoing embodiments are the same, and the details will not be repeated here.

In some examples, a step of forming the first alignment film 5 includes coating, photolithography, exposure, development, prebaking, baking and a rubbing alignment process.

It will be noted that a rubbing direction of the rubbing alignment process may determine directions of the pretilt angles of the liquid crystal molecules. That is, the rubbing direction of the rubbing alignment process may determine alignment directions of the liquid crystal molecules.

For example, a temperature of the baking is in a range from 200° C. to 230° C.

For example, a duration of the baking is 30 min.

For example, a temperature of the prebaking is in a range from 90° C. to 120° C.

For example, a duration of the prebaking is in a range from 100 s to 200 s.

It will be noted that in the step of forming the first alignment film 5, the temperature of the prebaking is relatively low and the duration of the prebaking is relatively short, and the temperature of the baking is relatively high and the duration of the baking is relatively long. Therefore, the heat resistance of the first planarization layer 15 and/or the second planarization layer 17 is mainly reflected in that the first planarization layer 15 and/or the second planarization layer 17 may each still maintain the excellent physical and mechanical properties after being subjected to the baking respectively.

In some embodiments, with continued reference to FIG. 18, after S4, the method of manufacturing the liquid crystal display panel 100 further includes S5.

In S5, spacers 7 are formed on a side of the first alignment film 5 away from the first substrate 1, so that the spacers 7 are located between the first substrate 1 and the second substrate 2 after the first substrate 1 and the second substrate 2 are assembled.

It will be noted that the method of manufacturing the liquid crystal display panel 100 provided in some of the above embodiments is used to manufacture the liquid crystal display panel 100 provided in some of the foregoing embodiments, the beneficial effects of the manufactured liquid crystal display panel 100 and the beneficial effects of the liquid crystal display panel 100 provided in some of the foregoing embodiments are the same, and the details will not be repeated here.

In some examples, a step of forming the spacers 7 includes coating, photolithography, exposure, development, prebaking and baking.

For example, a temperature of the baking is in a range from 200° C. to 230° C.

For example, a duration of the baking is 30 min.

For example, a temperature of the prebaking is in a range from 90° C. to 120° C.

For example, a duration of the prebaking is in a range from 100 s to 200 s.

It will be noted that in the step of forming the spacers 7, the temperature of the prebaking is relatively low and the duration of the prebaking is relatively short, and the temperature of the baking is relatively high and the duration of the baking is relatively long. Therefore, the heat resistance of the first planarization layer 15 and/or the second planarization layer 17 is mainly reflected in that the first planarization layer 15 and/or the second planarization layer 17 may each still maintain the excellent physical and mechanical properties after being subjected to the baking respectively.

In conclusion, the method of manufacturing the liquid crystal display panel 100 provided in some of the above embodiments is used to manufacture the liquid crystal display panel 100 provided in some of the foregoing embodiments, in the liquid crystal display panel 100, the first planarization layer 15 is able to planarize the color filter layer 12 and reduce the level difference thereof, thereby reducing the difficulty of manufacturing the subsequent film layers.

In addition, the material of the first planarization layer 15 provided by some embodiments of the present disclosure additionally includes polyimide with the high heat resistance and the high transmissions for light rays on the basis of including other resins (e.g., the acrylic resin) to ensure the fluidity of this material, so as to improve the heat resistance of the material of the first planarization layer 15. In this way, in the process of manufacturing the liquid crystal display panel 100, the material of the first planarization layer 15 may still maintain the stable and excellent transmittances for the light rays in the visible range after being subjected to the baking more than once (e.g., the baking in the step of forming the first optical compensation layer 16, the baking in the step of forming the first alignment film 5 and the baking in the step of forming the spacers 7), so that the color temperature and the contrast of the liquid crystal display panel 100 during display are improved. As a result, the display effect of the liquid crystal display panel 100 is improved.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A liquid crystal display panel, comprising:
    a first substrate and a second substrate that are disposed opposite to each other; and
    a liquid crystal layer located between the first substrate and the second substrate;
    wherein the first substrate includes:
        a first base;
        a color filter layer located on a side of the first base proximate to the liquid crystal layer;
        a first planarization layer located on a side of the color filter layer proximate to the liquid crystal layer and covering the color filter layer, wherein a material of the first planarization layer includes a resin mixture containing polyimide; the resin mixture further contains: an acrylic resin; and a birefringence of the first planarization layer for any light ray in a visible range is less than or equal to 0.002;
a first optical compensation layer located on a side of the first planarization layer proximate to the liquid crystal layer; and
a second planarization layer located on a side of the first optical compensation layer proximate to the liquid crystal layer, wherein a material of the second planarization layer is the same as the material of the first planarization layer;
wherein the second substrate includes:
a second base;
a circuit structure layer located on a side of the second base proximate to the liquid crystal layer;
a third planarization layer located on a side of the circuit structure layer proximate to the liquid crystal layer and covering the circuit structure layer; wherein a material of the third planarization layer is the same as the material of the first planarization layer; and
a second alignment film; wherein the second alignment film is located between the third planarization layer and the liquid crystal layer.

2. The liquid crystal display panel according to claim 1, wherein
a transmittance of the first planarization layer for any light ray in a visible range is greater than or equal to 90%.

3. The liquid crystal display panel according to claim 1, wherein
the first planarization layer also serves as a first alignment film.

4. The liquid crystal display panel according to claim 1, wherein
the first optical compensation layer is a +A compensation film layer.

5. The liquid crystal display panel according to claim 1, wherein
the second planarization layer also serves as a first alignment film.

6. A display apparatus, comprising:
the liquid crystal display panel according to claim 1.

7. The liquid crystal display panel according to claim 1, further comprising a first alignment film; wherein
the first alignment film is located between the first planarization layer and the liquid crystal layer.

8. A method of manufacturing a liquid crystal display panel, the method comprising:
forming a first substrate and a second substrate; and
assembling the first substrate and the second substrate to form the liquid crystal display panel, the liquid crystal display panel further including a liquid crystal layer between the first substrate and the second substrate;
wherein a step of forming the first substrate includes:
forming a color filter layer, a first planarization layer, a first optical compensation layer and a second planarization layer on a first base in sequence; wherein a material of the first planarization layer includes a resin mixture containing polyimide; the resin mixture further contains: an acrylic resin; a birefringence of the first planarization layer for any light ray in a visible range is less than or equal to 0.002; and a material of the second planarization layer is the same as the material of the first planarization layer;
wherein a step of forming the second substrate includes:
forming a circuit structure layer, a third planarization layer and a second alignment film on a second base in sequence; wherein a material of the third planarization layer is the same as the material of the first planarization layer.

9. The method according to claim 8, wherein a step of forming the first planarization layer includes:
forming a film layer on a side of the color filter layer away from the first base; and
performing photolithography, exposure, development and baking on the film layer to form the first planarization layer;
wherein a material of the film layer includes a resin mixture solution containing polyimide and/or polyamic acid.

10. The method according to claim 9, wherein a temperature of the baking is in a range from 200° C. to 230° C., and a duration of the baking is 30 min.

11. The method according to claim 9, wherein before the baking, the step further includes:
performing prebaking on a developed film layer.

12. The method according to claim 11, wherein
a temperature of the prebaking is in a range from 90° C. to 120° C., and a duration of the prebaking is in a range from 100 s to 200 s.

* * * * *